United States Patent
Gao et al.

(10) Patent No.: US 11,817,921 B2
(45) Date of Patent: Nov. 14, 2023

(54) SYSTEM AND METHOD FOR ADAPTIVE FILTERING

(71) Applicant: Telefonaktiebolaget LM Ericsson (publ), Stockholm (SE)

(72) Inventors: Hao Gao, Beijing (CN); Haiying Cao, Beijing (CN); Sheng Liu, Beijing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 344 days.

(21) Appl. No.: 17/270,010

(22) PCT Filed: Oct. 31, 2018

(86) PCT No.: PCT/CN2018/112980
§ 371 (c)(1),
(2) Date: Feb. 20, 2021

(87) PCT Pub. No.: WO2020/087339
PCT Pub. Date: May 7, 2020

(65) Prior Publication Data
US 2021/0203386 A1    Jul. 1, 2021

(51) Int. Cl.
*H04B 7/0413*    (2017.01)
*H03H 17/02*    (2006.01)

(52) U.S. Cl.
CPC ....... *H04B 7/0413* (2013.01); *H03H 17/0294* (2013.01)

(58) Field of Classification Search
CPC ........................ H04B 7/0413; H03H 17/0294
See application file for complete search history.

(56) References Cited

U.S. PATENT DOCUMENTS

| | | | |
|---|---|---|---|
| 2006/0288064 A1* | 12/2006 | Barron | H03H 21/0014 708/300 |
| 2009/0156142 A1 | 6/2009 | Matsuura | |
| 2012/0027066 A1 | 2/2012 | O'Keeffe | |

FOREIGN PATENT DOCUMENTS

| | | |
|---|---|---|
| CN | 105940552 A | 9/2016 |
| CN | 107453791 A | 12/2017 |
| EP | 1746720 A1 | 1/2007 |
| EP | 3267579 A1 | 1/2018 |

OTHER PUBLICATIONS

Madampu et al. "a Comparative analysis of Adaptive digital predistortion algorithms for multiple antenna transmitters", May 2015, IEEE transactions on circuits and systems, vol. 62, No. 5, pp. 1412-1420 (Year: 2015).*

(Continued)

*Primary Examiner* — Rahel Guarino
(74) *Attorney, Agent, or Firm* — Withrow & Terranova, PLLC

(57) ABSTRACT

A method in an adaptive filter system is provided. The method comprises obtaining parameters for a plurality of branches of the adaptive filter system. The method further comprises computing gradient-based information for a selected one of the plurality of branches. The method further comprises updating the parameters for the plurality of branches based on the gradient-based information for the selected branch. An adaptive filter system is also provided.

20 Claims, 6 Drawing Sheets

(56) References Cited

OTHER PUBLICATIONS

Jiao et al. "a novel Gradient adaptive step size LMS algorithms with dual Adaptive filters", 35th Annual International Conference of the IEEE, Jul. 3-7, 2013, pp. 4803-4806 (Year: 2013).*
Chen, Guo-jun et al., "A Optimization Method of Channel Estimation based on Adaptive Filtering," Communications Technology, vol. 46, No. 06, Dec. 31, 2013, pp. 5-8.
Liu, Ling et al., "Single-PA-Feedback Digital Predistortion for Beamforming MIMO Transmitter," International Conference on Microwave and Millimeter Wave Technology (ICMMT), Beijing, 2016, 3 pages.
Zaidi, Ali A. et al, "5G New Radio: Designing for the Future: The 5G NR Physical Layer," Ericsson Technology Review, vol. 7, Ericsson AB, Jun. 27, 2017, 14 pages.
Zinkevich, Martin A. et al., "Parallelized Stochastic Gradient Descent," Advances in Neural Information Processing Systems, vol. 23, Jan. 2010, Vancouver, 9 pages.
International Search Report and Written Opinion for International Patent Application No. PCT/CN2018/112980, dated Jul. 3, 2019, 8 pages.
Examination Report for Indian Patent Application No. 202147023219, dated Mar. 22, 2022, 6 pages.
Lee, Sangil, et al., "Digital Predistortion for Power Amplifiers in Hybrid MIMO Systems with Antenna Subarrays," Vehicular Technology Conference, May 2015, IEEE, 5 pages.
Extended European Search Report for European Patent Application No. 18938513.1, dated Dec. 17, 2021, 8 pages.

* cited by examiner

SYSTEM AND METHOD FOR ADAPTIVE FILTERING

This application is a 35 U.S.C. § 371 national phase filing of International Application No. PCT/CN2018/112980, filed Oct. 31, 2018, the disclosure of which is incorporated herein by reference in its entirety.

TECHNICAL FIELD

The disclosure relates generally to filter systems, and more particularly, to a system and method for adaptive filtering.

BACKGROUND

Massive Multiple-Input-Multiple-Output (MIMO) is one of the key technologies in wireless communication systems (for example, 5G wireless communication systems). Generally, a large number of compact antennae (e.g., 32, 64, 128 or even 256) are integrated into a single radio device for better beamforming. Each of the antennae has an adaptive filter for signal transmission. However, massive antennae bring lots of challenges to antenna branch based Radio Frequency (RF) circuit compensation algorithm (such as the digital pre-distortion (DPD) algorithm) in terms of computation load, resource utilization, and convergence speed.

SUMMARY

In an aspect of the disclosure, a method in an adaptive filter system is provided. The method comprises obtaining parameters for a plurality of branches of the adaptive filter system. The method further comprises computing gradient-based information for a selected one of the plurality of branches. The method further comprises updating the parameters for the plurality of branches based on the gradient-based information for the selected branch.

The proposed method transfers the gradient-based information among all branches of the adaptive filter system. In other words, the result of gradient-based information for a selected branch is shared by all the other branches, and the parameter update process for all the branches can be uninterrupted. Thus, the proposed method can improve the tracking capability and the convergence speed of the adaptive filter system.

In an embodiment, the parameter for the selected one of the plurality of branches is updated by adding parameter for the selected branch to a product of the gradient-based information and a first ratio. The first ratio is larger than zero.

In an embodiment, the parameter for a respective one of the plurality of branches other than the selected branch is updated by adding parameter for the respective branch to a product of the gradient-based information and a second ratio. The second ratio is larger than zero and dependent on a similarity between the respective branch and the selected branch.

In an embodiment, the similarity is based on an angle between gradient vectors for the respective branch and the selected branch. In another embodiment, the similarity is based on hardware structure and working condition of the respective branch and the selected branch. In a further embodiment, the similarity is based on a model for describing the respective branch and the selected branch and model parameters thereof.

In an embodiment, the updating is performed by using a gradient based algorithm. For example, the gradient based algorithm may comprise any of Least Mean Square (LMS) algorithm, Normalized LMS (NLMS) algorithm, Stochastic Gradient Descent (SGD) algorithm, recursive least square (RLS) algorithm, and Simultaneous Perturbation Stochastic Approximation (SPSA) algorithm.

In an embodiment, the selected branch is selected from the plurality of branches in circular order without priority.

In an embodiment, the adaptive filter system may include a digital pre-distortion system.

In another aspect of the disclosure, an adaptive filter system is provided which comprises one or more processor and a memory. The memory contains instructions executable by the one or more processor whereby the adaptive filter system is operative to perform the methods in accordance with the above aspects of the disclosure.

In a further aspect of the disclosure, a computer program comprising computer program code means is provided. The computer program code means may cause, when executed on a processor, the processor to perform the methods in accordance with the above aspects of the disclosure.

In a yet further aspect of the disclosure, a computer readable storage medium is provided. The computer readable storage medium has stored thereon the computer program in accordance with the above aspects of the disclosure.

With the proposed schemes of the disclosure, the number of parallel branches of an adaptive filter system can be increased. Moreover, the convergence speed on each branch of the adaptive filter system is significantly accelerated and the total computation load for reaching the convergence state is reduced. Thus the proposed schemes of the disclosure improve the tracking capability and the convergence speed of the adaptive filter system.

BRIEF DESCRIPTION OF THE DRAWINGS

The schemes herein are illustrated, by way of example and not by way of limitation, in the figures of the accompanying drawings in which like references indicate similar elements. In the drawings.

DETAILED DESCRIPTION

In the discussion that follows, specific details of particular embodiments of the present disclosure are set forth for purposes of explanation and not limitation. It will be appreciated by those skilled in the art that other embodiments may be employed apart from these specific details. Furthermore, in some instances detailed descriptions of well-known methods, nodes, interfaces, circuits, and devices are omitted so as not to obscure the description with unnecessary detail. Those skilled in the art will appreciate that the functions described may be implemented in one or several nodes.

It should be noted that references to "an" or "one" or "some" embodiment(s) in this disclosure are not necessarily to the same embodiment, and such references refer to at least one embodiment.

As used herein, the term "user equipment" refers to any device that can access a wireless communication network and receive services therefrom. By way of example and not limitation, a user equipment (UE) may include, but is not limited to, a mobile phone, a cellular phone, a smart phone, a tablet, a wearable device, a personal digital assistant (PDA), and the like.

The term "network node" used herein refers to a device at the network side and may include a network device via which a terminal device accesses the network and receives services therefrom. By way of example, such a network node may be a base station (BS), a node B (NodeB or NB), an evolved NodeB (eNodeB or eNB), a gNB, a Remote Radio Unit (RRU), a radio header (RH), a remote radio head (RRH), a relay, a low power node such as a femto, a pico, and so forth.

Figure 1:
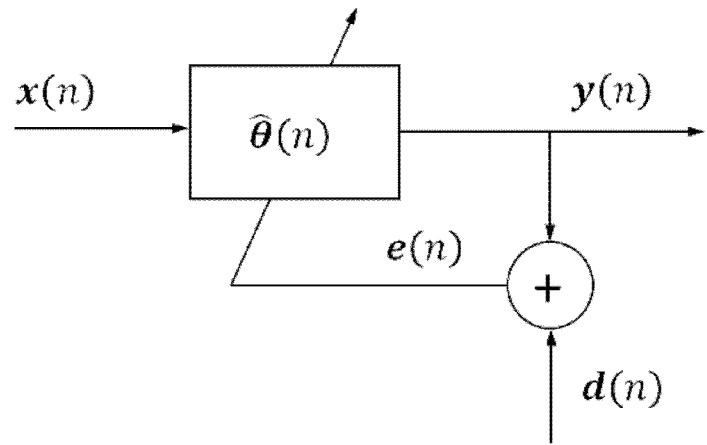
FIG. 1 is a schematic showing a basic adaptive filter.

FIG. 1 is a schematic showing a basic adaptive filter which can be employed in various scenarios. For example, it can be used in an adaptation process of DPD to mimic a desired filter by estimating the filter coefficients dynamically. As shown in FIG. 1, the model parameters for the adaptive filter are represented by $\hat{\theta}(n)$. The input data $x(n)$ is input into the adaptive filter which generates output data $y(n)$. The output data is further subtracted from desired data $d(n)$ so that error data $e(n)$ is obtained and fed back to the adaptive filter.

A data-parallel adaptive filter system uses data parallelism to increase the capacity of the adaptive filter. As an adaptive filter system with the capability to learn, it also treats the desired signal as the "supervisor" and minimizes the error between its output and the desired signal. The data dimension in the data-parallel adaptive filter system may be very high since the data is placed on multiple parallel branches. For example, massive MIMO is such a data-parallel system in which most of the linearization block is designed in the framework of adaptive filters and thus can be treated as data-parallel adaptive filters. In this system, DPD algorithm can be used to linearize power amplifiers (PA) and to correct the nonlinearity on the receiver. Compared to conventional radio base station (RBS) which only has one main final stage PA exhibiting nonlinearity, however, it is necessary to compensate for the nonlinear distortion from tens or hundreds of PAs in MIMO scenarios.

To save DPD resource, the round-robin scheduling can be used in which time slices of the DPD are assigned to each branch in equal portions and in circular order without priority. Advantage of this implementation is that it can greatly reduce the chip resource utilization, but at the cost of longer convergence time and higher computation load to reach the converged state. Under round-robin adaptation scheduling and independent adaptation, the adaptation computation complexity in terms of time can be represented as O(N), where N is the number of parallel branches. With more and more parallel branches shared by a single adaptation block, the total computation load becomes extremely high while the convergence speed for a single branch becomes extremely slow, since only 1/N adaptation time is allocated to each branch on average. In particular, DPD needs to track the changes of PA characteristics in time due to temperature or bias point variations. If the number of parallel branches is very large, the frequency of updating the pre-distortion coefficients online to track the PA changes will be very low. For example, the DPD performance will be poor when the PA performance changes dramatically due to temperature variations or some other factors.

Moreover, for 5G NR (New Radio) signal in TDD transmission, UL/DL switching can be very flexible. Therefore, it is important to speed up the convergence since the adaptation time for DPD can be very short. In massive MIMO, considering that the number of digital chains is much less than PA quantities, it is unrealistic to construct a digital pre-distorter for each PA.

The disclosure provides a new data-parallel based adaptive filter scheme which transfers the gradients among all branches. In an example, the gradient calculation can work under a framework in which the result of the gradient-based information is shared by all of the branches based on the branch similarity, and the parameter update process for all of the branches are uninterrupted.

Figure 2:
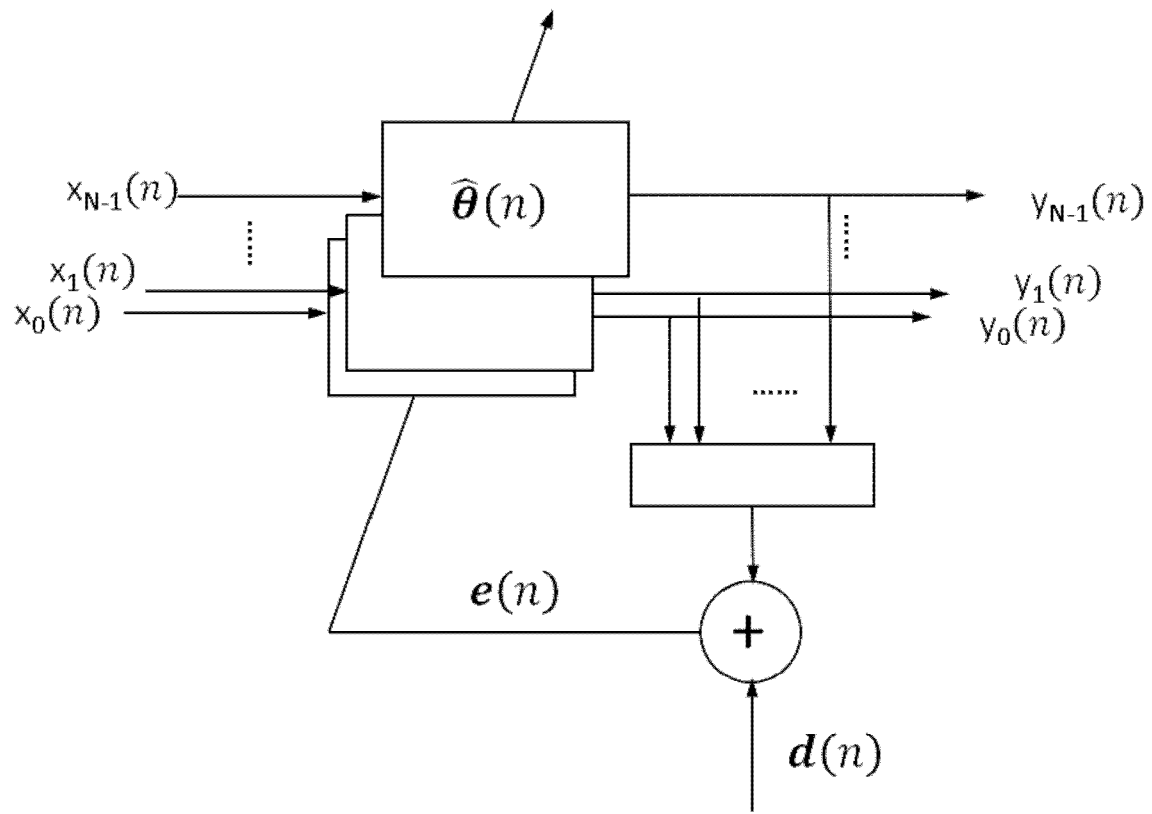
FIG. 2 is a schematic showing an overview of a data-parallel adaptive filter system according to an embodiment of the disclosure.

FIG. 2 is a schematic showing an overview of a data-parallel adaptive filter system according to an embodiment of the disclosure. As shown in FIG. 2, the data-parallel adaptive filter system comprises N parallel branches, In fact, the data-parallel adaptive filter system of FIG. 2 can be regarded as a parallel arrangement of N adaptive filters of FIG. 1.

In discrete time domain, the ith branch of the data-parallel adaptive filter with memory can be generally modeled as:

$$y(n)=f(x(n),\theta_i(n))$$

where $y(n)$ is the model output, $x(n)=[x(n), x(n-1), \ldots, x(n-M)]$ is the model input, and $\theta_i(n)$ is the model parameters, for $i=0, 1, 2, \ldots, N-1$. N is the number of parallel branches of the adaptive filter, M represents memory effect of the adaptive filter, n represent the nth discrete time point, and the system function f( ) gives output of the adaptive filter, i.e., $y(n)$ The model parameter $\theta$ always slowly changes according to the environment, such as ambient temperature, static operating point of component, etc.

Two parallel branches are called similar if they have the same model structure, and more importantly, with similar model parameters at any time, i.e.:

$$\|\theta_i(n)-\theta_j(n)\|_2 \leq \delta, (i \neq j)$$

where $\|\cdot\|_2$ is the $l_2$ vector norm, $\theta_i(n)$ represents the model parameters on branch i at time n, $\theta_j(n)$ represents the model parameters on branch j at time n, and $\delta$ is a small value. Since the system function $f(\cdot)$ is generally treated as a continuous function, therefore there is $\delta$, which satisfies $\|\theta_i(n)-\theta_j(n)\|_2 \leq \delta$. For any $\varepsilon$, $$|f(x(n),\theta_i(n))-f(x(n),\theta_j(n))| \leq \varepsilon$$

which means the parallel branch performance will be similar. This potentially requires the component characteristic as well as the working environment should be similar between two branches at any time. And it typically relies on the chip design as well as the hardware design to ensure the branch similarities. For example, in massive MIMO case, as more and more RF functions are integrated into a single chip, it becomes much easier to achieve the similarity between different branches. For antenna branches which belong to one beam in beamforming, the working condition of PAs (e.g., the power level) can be very similar.

Within a parallel branch group in which any two branches are similar, it is required to exchange the learnt results among all similar branches to accelerate the convergence and simplify the adaptation. Thus, instead of doing round-robin scheduling and independent adaptation across the parallel branches, the proposed algorithm is to transfer the gradient-based information of one branch i, i.e., $\nabla_{\theta_i}J(\theta_i(n))$, to all the other branches j, j≠i. Therefore, the adaptation process for all branches is uninterruptible.

It should be noted that although the branch similarity is required, the proposed scheme can still work for PAs with different characteristics, as shown in the simulation results below.

Figure 3:
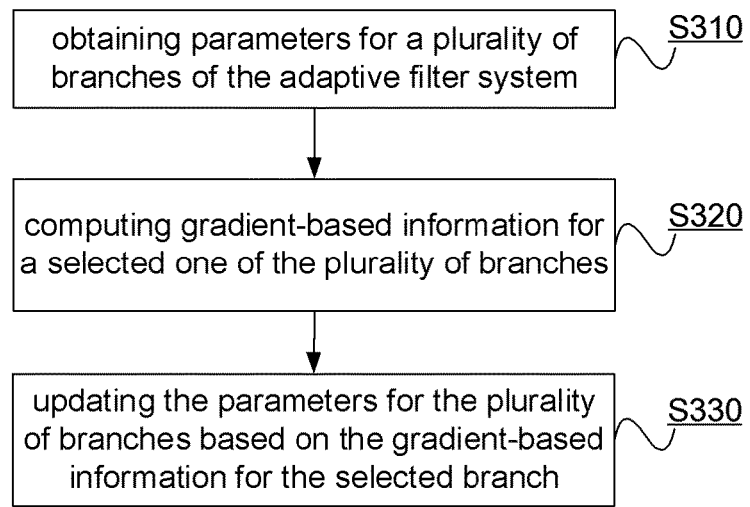
FIG. 3 is a flowchart illustrating a method in an adaptive filter system according to an embodiment of the disclosure.

FIG. 3 is a flowchart illustrating a method in an adaptive filter system according to an embodiment of the disclosure. For example, the adaptive filter system may be a digital pre-distortion system.

At block S310, parameters for a plurality of branches of the adaptive filter system are obtained. The parameters are model parameters for describing respective branches of the adaptive filter system.

At block S320, gradient-based information for a selected one of the plurality of branches is computed. In an embodiment, the selected branch is selected from the plurality of branches in circular order without priority, as the same way in the round-robin scheduling.

At block S330, the parameters for the plurality of branches are updated based on the gradient-based information for the selected branch. In an embodiment, the updating can be performed by using a gradient based algorithm such as Least Mean Square (LMS) algorithm, Normalized LMS (NLMS) algorithm, Stochastic Gradient Descent (SGD) algorithm, recursive least square (RLS) algorithm, and Simultaneous Perturbation Stochastic Approximation (SPSA) algorithm, to name a few.

In an embodiment, the parameter for the selected one of the plurality of branches is updated by adding parameter for the selected branch to a product of the gradient-based information and a first ratio, the first ratio being larger than zero.

In another embodiment, the parameter for a respective one of the plurality of branches other than the selected branch is updated by adding parameter for the respective branch to a product of the gradient-based information and a second ratio, the second ratio being larger than zero and dependent on a similarity between the respective branch and the selected branch. For example, the similarity is based on an angle between gradient vectors for the respective branch and the selected branch, or the similarity is based on hardware structure and working condition of the respective branch and the selected branch, or the similarity is based on a model for describing the respective branch and the selected branch and model parameters thereof.

Figure 4:
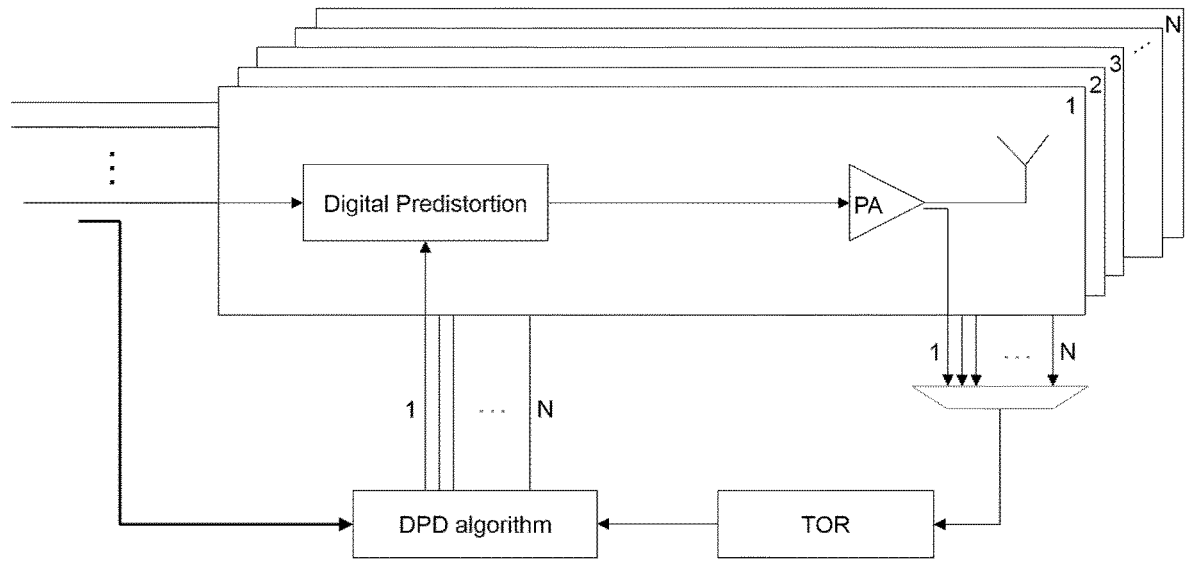
FIG. 4 is a block diagram illustrating an example application of adaptive filtering according to an embodiment of the disclosure.

FIG. 4 is a block diagram illustrating an example application of adaptive filtering according to an embodiment of the disclosure. Specifically, it shows an example application for DPD in multi-antenna case. As can be seen from FIG. 4, N represent the number of parallel branches each of which has a digital pre-distortion block and a power amplifier (PA) block. The output of N PAs are aggregated in the TOR block which generates an output and provides it to the DPD algorithm block. The DPD algorithm block provides the adaptation result for each branch to all of the branches of the adaptive filter. In other words, the adaptation result for each branch can be shared among all of the branches.

In the following, an algorithm implementation of the method of FIG. 3 is given. In this implementation, the cost function J(·) is defined as:

$$J(\theta_i(n))=\|f(x(n),\theta_i(n))-d(n)\|_2^2;$$

where $\|\cdot\|_2$ is the $\ell_2$ vector norm, and d(n) is the desired data. The update for the branch i is performed so that the data from branch z is used to calculate the gradient by:

$$\theta_i(n+1)=\theta_i(n)+\alpha_i\nabla_{\theta_i}J(\theta_i(n))$$

where $\alpha_i>0$ is the learning rate, and $\nabla$ is the gradient operator. Meanwhile the update for the other branches j for j≠i is performed by:

$$\theta_j(n+1)=\theta_j(n)+\beta_{i,j}\nabla_{\theta_i}J(\theta_i(n))$$

where the learning rate $\beta_{i,j}>0$ is based on the similarity between branches and j. Here one choice to characterize the similarity is based on the angle between the gradient vectors. Therefore, the similarity between branches i and j can be defined as:

$$\beta_{i,j}=\frac{\mu\cdot\langle\nabla_{\theta_i}J(\theta_i),\nabla_{\theta_j}J(\theta_j)\rangle}{\|\nabla_{\theta_i}J(\theta_i)\|_2\cdot\|\nabla_{\theta_j}J(\theta_j)\|_2}$$

where $\langle,\rangle$ is the dot product, and $\mu<0$ is a scalar. Moreover, given a priori information of $\beta_{i,j}$ the value of $\beta_{i,j}$ can be pre-assigned.

Figure 5:
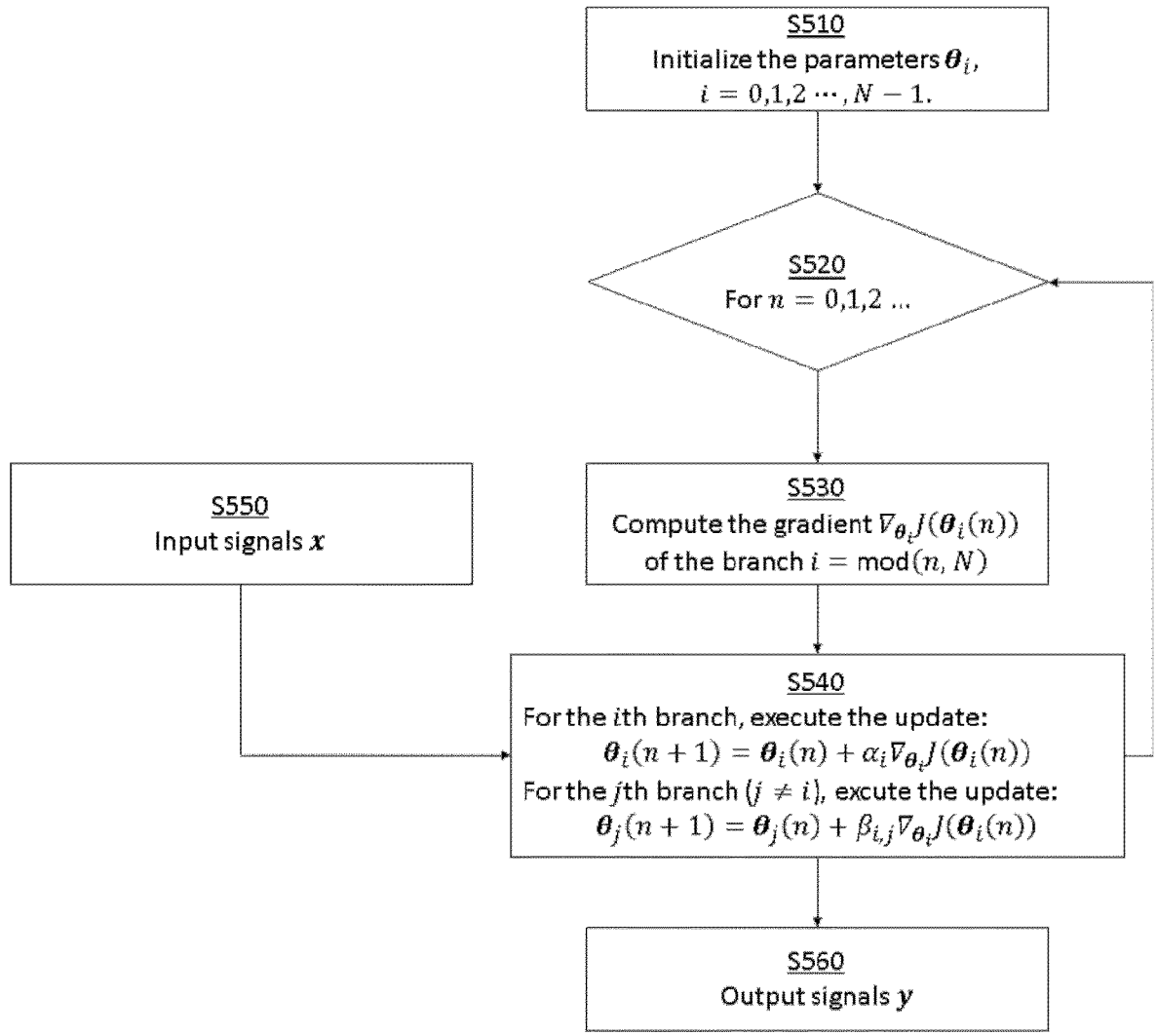
FIG. 5 is a flowchart illustrating a gradient transfer process according to an embodiment of the disclosure.

FIG. 5 is a flowchart illustrating a gradient transfer process according to an embodiment of the disclosure.

At block S510: Initialize the parameters for branches $\theta_1$, i–0,1, . . . , N–1.

At block S520: Start updating the parameters for time slot n=0, 1, 2, . . . .

At block S530: Compute the gradient-based information $g_i$ (n) of the branch i which is selected at the current adaptation time slot n:

$$g_i(n)=\nabla_{\theta_i}J(\theta_i(n))$$

At block S540: Use the gradient $g_i(n)$ of the branch i to update the parameters of all branches:

For the ith branch, execute the update:

$$\theta_i(n+1)=\theta_i(n)+\alpha_i\nabla_{\theta_i}J(\theta_i(n))$$

For the jth branch (j≠i), execute the update:

$$\theta_j(n+1)=\theta_j(n)+\beta_{i,j}\nabla_{\theta_i}J(\theta_i(n))$$

At block S550: Input signals x

At block S560: Output signals y

It is noted that various types of gradient-based information can be used to perform the parameter update, which is based on the specific application.

In the next, simulations results of the proposed schemes will be described with referent to FIGS. 6-7.

In the simulations, the proposed gradient transfer scheme is used to estimate coefficients of a DPD system. FIGS. 6-7 show the normalized mean square error (NMSE) as a function of iteration steps. For illustrative purposes, there are 3 branches in total, i.e., PA1, PA2 and PA3. The solid line represents 3 branches under the independent round-robin adaptation. The dotted line represents 3 branches under the proposed gradient transfer adaptation.

Figure 6:
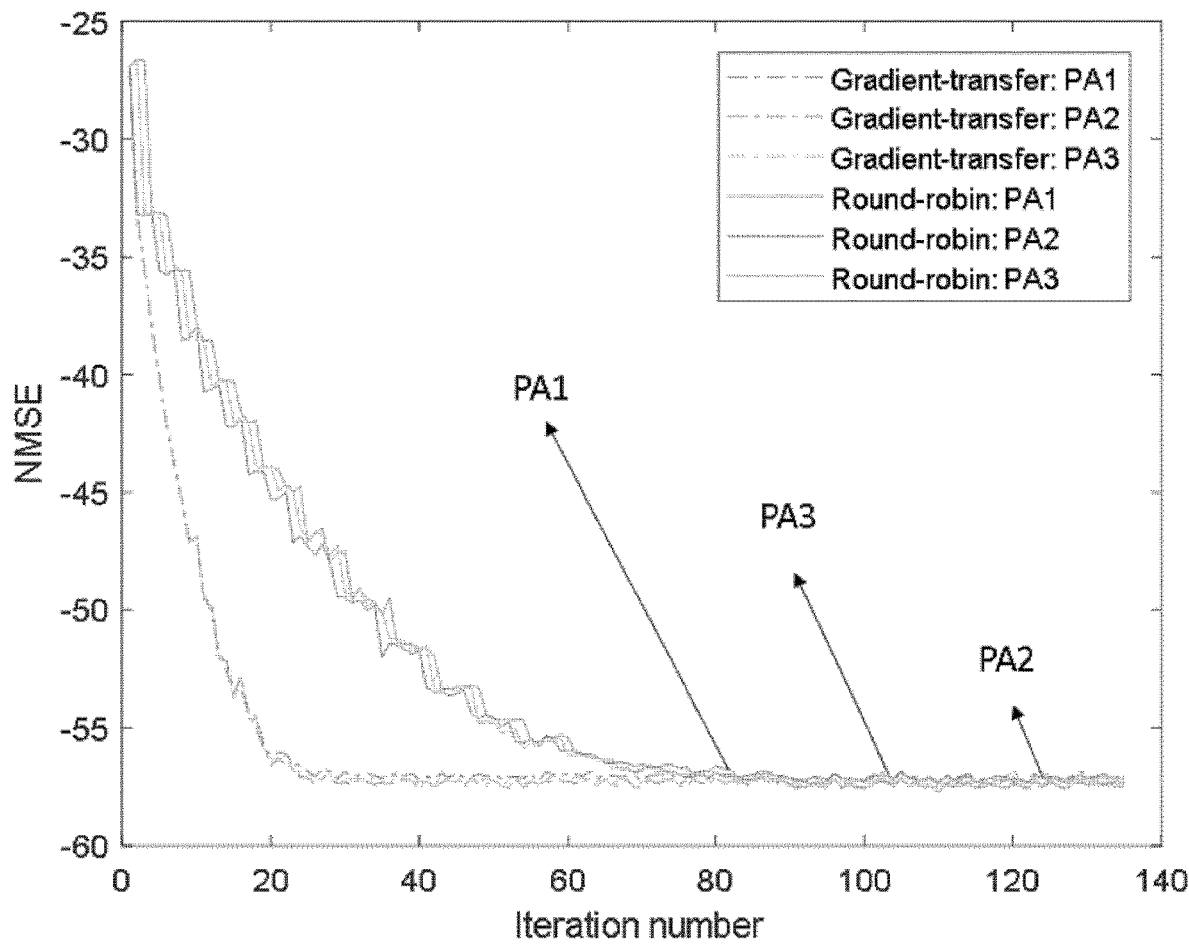
FIG. 6 is a diagram illustrating results of simulation of the gradient transfer process according to an embodiment of the disclosure.

In FIG. 6, the NMSE of PA1, PA2 and PA3 all converges to −57 dB, since the characteristics of PA1, PA2 and PA3 are very similar. It can be seen that it takes about 60 iteration steps for the solid line of round-robin to reach the stable state, while it takes about 20 iteration steps for the dotted line of gradient transfer to reach the stable state. Thus, the proposed gradient transfer scheme converges O(N) times faster than the round robin scheme, where N is the number of parallel branches.

Figure 7:
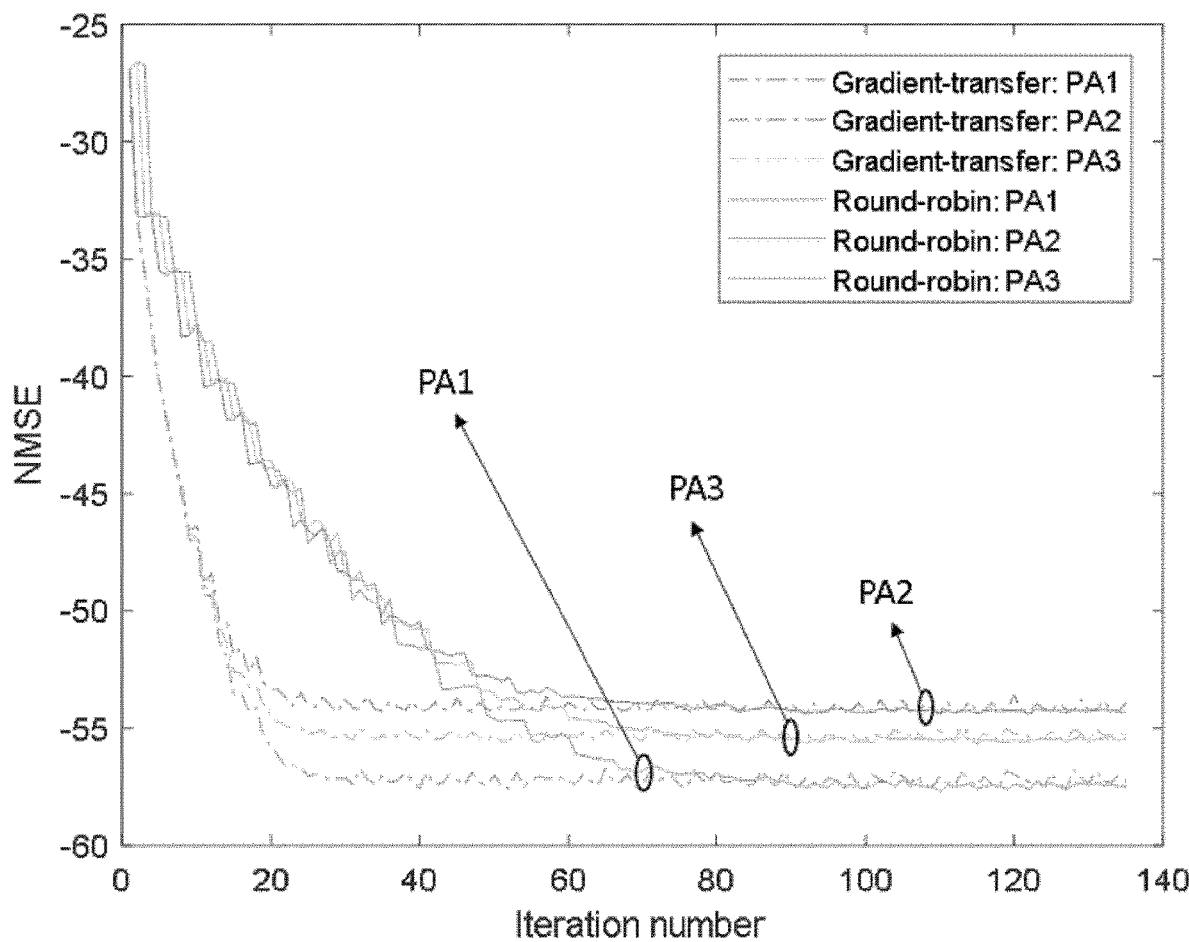
FIG. 7 is a diagram illustrating results of simulation of the gradient transfer process according to an embodiment of the disclosure.

In FIG. 7, the characteristics of PA1, PA2 and PA3 are not similar, and they converge to different NMSE values. However, in this case the proposed gradient transfer scheme still converges O(N) times faster than the round-robin scheme. Therefore, it can be concluded that the proposed gradient transfer scheme is more efficient than the round-robin scheme.

Assuming that the computation complexity for calculating the gradient-based information in one iteration step is defined as $c_1$, the computation complexity for the parameter update on one branch is defined as $c_2$, and convergence iteration step number of the independent round-robin adaptation is defined as L. For illustrative purposes and without loss of generality, the convergence iteration step number of the proposed gradient transfer scheme can be defined as L/N, which ignores a scaling factor.

The total complexity of the independent round-robin adaptation is as follows:

$$c_{RR} = (c_1 c_2) \cdot L = Lc_1 + Lc_2$$

Compared thereto, the total complexity of the proposed gradient transfer scheme is as follows:

$$C_{GT} = (c_1 + Nc_2) \cdot \frac{L}{N} = \frac{L}{N} c_1 + Lc_2$$

Therefore, the proposed gradient transfer scheme reduces the total computation load for calculating the gradients. As a result, the proposed gradient transfer scheme speeds up the convergence process of the adaptive filter, enhances the capability of tracking dynamic signals, meanwhile keeps the complexity very limited.

In addition, the proposed scheme has good compatibility with existing round-robin scheduling framework. Specifically, the gradient calculation can be still under the round-robin scheduling and the result of the gradient is shared among all branches. Therefore, the increased complexity of the proposed scheme is limited.

Figure 8:
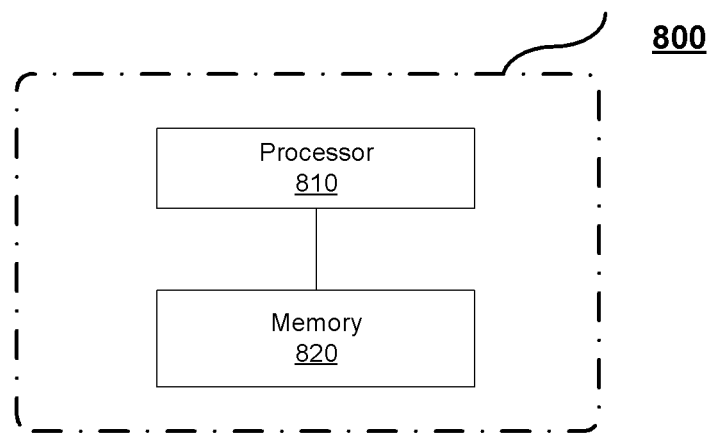
FIG. 8 is a block diagram of an adaptive filter system according to an embodiment of the disclosure.

FIG. 8 is a block diagram of an adaptive filter system according to an embodiment of the disclosure. As shown in FIG. 8, adaptive filter system 800 may comprise a processor 810 and a memory 820 coupled to the processor 810. The memory 820 contains instructions executable by the processor 810 whereby adaptive filter system 800 is operative to perform the methods as have been described above.

The processor 810 may be implemented, for example, by a CPU (Central processing unit), and could also be implemented by other types of devices. For example, the processor 810 may be implemented by one or more general purpose microprocessors, instruction set processors and/or special purpose microprocessors such as Application Specific Integrated Circuit (ASICs).

The memory 820 may be implemented by various types of storage devices. For example, the memory 820 may be a volatile storage device such as Random Access Memory (RAM). The memory 820 may also be a non-volatile storage device such as Read Only Memory (ROM). One of ordinary skill in the art can envisage that other types of storage devices can be utilized to implement the memory 820.

The embodiments of the disclosure can be implemented in computer program products. This arrangement of the disclosure is typically provided as software, codes and/or other data structures provided or coded on a computer readable medium (such as an optical medium, e.g., CD-ROM, a floppy disk or a hard disk), or firmware or micro codes on other mediums (such as one or more ROMs, RAMs or PROM chips), or downloadable software images or shared databases in one or more modules.

Figure 9:
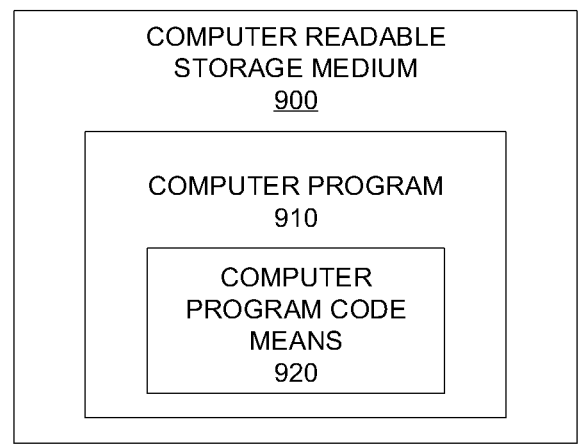
FIG. 9 is a block diagram of a computer readable storage medium having stored thereon a computer program comprising computer program code means according to an embodiment of the disclosure.

FIG. 9 is a block diagram of a computer readable storage medium having stored thereon a computer program comprising computer program code means according to an embodiment of the disclosure. As shown in FIG. 9, a computer readable medium 900 has stored thereon a computer program 910. The computer program 910 comprises computer program code means 920 for performing, when executed by at least one processor, the methods according to the disclosure as mentioned above. The computer readable medium 900 may have the form of a non-volatile or volatile memory, e.g., an Electrically Erasable Programmable Read-Only Memory (EEPROM), a flash memory, a floppy disk, and a hard drive, etc. The computer program code means 920 may include codes/computer readable instructions in any format.

Conditional language used herein, such as "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. Further, the term "each," as used herein, in addition to having its ordinary meaning, can mean any subset of a set of elements to which the term "each" is applied.

The terms "first" and "second" refer to different elements. The singular forms "a" and "an" are intended to include the plural forms as well, unless the context clearly indicates otherwise. The term "based on" is to be read as "based at least in part on." The term "one embodiment" and "an embodiment" are to be read as "at least one embodiment." The term "another embodiment" is to be read as "at least one other embodiment." Other definitions, explicit and implicit, may be included below.

In addition, language such as the phrase "at least one of X, Y and Z," unless specifically stated otherwise, is to be understood with the context as used in general to convey that an item, term, etc. may be either X, Y, or Z, or a combination thereof. Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations.

The disclosure has been described with reference to embodiments and drawings. It should be understood that various modifications, alternations and additions can be made by those skilled in the art without departing from the spirits and scope of the disclosure. Therefore, the scope of the disclosure is not limited to the above particular embodiments but only defined by the claims as attached and equivalents thereof.

The invention claimed is:

1. A method in an adaptive filter system, the method comprising:
   obtaining a plurality of parameters for a plurality of branches of the adaptive filter system, each parameter of the plurality of parameters corresponding to one of the plurality of branches;
   computing gradient-based information for a selected one of the plurality of branches; and
   updating the plurality of parameters for the plurality of branches based on the gradient-based information for the selected branch,
   wherein the updating the plurality of parameters comprises, for a parameter of the plurality of parameters that corresponds to the selected one of the plurality of branches, updating the parameter by adding the parameter to a product of the gradient-based information and a first ratio, the first ratio being larger than zero.

2. The method according to claim 1, wherein a respective parameter of the plurality of parameters for a respective branch of the plurality of branches other than the selected branch is updated by adding the respective parameter for the respective branch to a product of the gradient-based information and a second ratio, the second ratio being larger than zero and dependent on a similarity between the respective branch and the selected branch.

3. The method according to claim 2, wherein the similarity is based on an angle between gradient vectors for the respective branch and the selected branch.

4. The method according to claim 2, wherein the similarity is based on hardware structure and working condition of the respective branch and the selected branch.

5. The method according to claim 2, wherein the similarity is based on a model for describing the respective branch and the selected branch and model parameters thereof.

6. The method according to claim 1, wherein the updating is performed by using a gradient based algorithm.

7. The method according to claim 6, wherein the gradient based algorithm comprises any of Least Mean Square (LMS) algorithm, Normalized LMS (NLMS) algorithm, Stochastic Gradient Descent (SGD) algorithm, recursive least square (RLS) algorithm, and Simultaneous Perturbation Stochastic Approximation (SPS A) algorithm.

8. The method according to claim 1, wherein the selected branch is selected from the plurality of branches in circular order without priority.

9. The method according to claim 1, wherein the adaptive filter system includes a digital pre-distortion system.

10. An adaptive filter system, comprising:
    one or more processors; and
    a memory having stored thereon instructions which, when run on the one or more processors, cause the one or more processors to execute operations including:
    obtain a plurality of parameters for a plurality of branches of the adaptive filter system, each parameter of the plurality of parameters corresponding to one of the plurality of branches;
    compute gradient-based information for a selected one of the plurality of branches; and
    update the plurality of parameters for the plurality of branches based on the gradient-based information for the selected branch,
    wherein the updating the plurality of parameters comprises, for a parameter of the plurality of parameters that corresponds to the selected one of the plurality of branches, updating the parameter by adding the parameter to a product of the gradient-based information and a first ratio, the first ratio being larger than zero.

11. The adaptive filter system according to claim 10, wherein a respective parameter of the plurality of parameters for a respective branch of the plurality of branches other than the selected branch is updated by adding the respective parameter for the respective branch to a product of the gradient-based information and a second ratio, the second ratio being larger than zero and depending on a similarity between the respective branch and the selected branch.

12. The adaptive filter system according to claim 11, wherein the similarity is based on an angle between gradient vectors for the respective branch and the selected branch.

13. The adaptive filter system according to claim 11, wherein the similarity is based on hardware structure and working condition of the respective branch and the selected branch.

14. The adaptive filter system according to claim 11, wherein the similarity is based on a model for describing the respective branch and the selected branch and model parameters thereof.

15. The adaptive filter system according to claim 10, wherein the updating is performed by using a gradient based algorithm.

16. The adaptive filter system according to claim 15, wherein the gradient based algorithm comprises any of Least Mean Square (LMS) algorithm, Normalized LMS (NLMS) algorithm, Stochastic Gradient Descent (SGD) algorithm, recursive least square (RLS) algorithm, and Simultaneous Perturbation Stochastic Approximation (SPSA) algorithm.

17. The adaptive filter system according to claim 10, wherein the selected branch is selected from the plurality of branches in circular order without priority.

18. The adaptive filter system according to claim 10, wherein the adaptive filter system includes a digital pre-distortion system.

19. A method in an adaptive filter system, the method comprising:
    obtaining a plurality of parameters for a plurality of branches of the adaptive filter system, each parameter of the plurality of parameters corresponding to one of the plurality of branches;
    computing gradient-based information for a selected one of the plurality of branches; and
    updating the plurality of parameters for the plurality of branches based on the gradient-based information for the selected branch,
    wherein the selected branch is selected from the plurality of branches in circular order without priority.

20. The method according to claim 19, wherein a respective parameter of the plurality of parameters for a respective branch of the plurality of branches other than the selected branch is updated by adding the respective parameter for the respective branch to a product of the gradient-based information and a second ratio, the second ratio being larger than zero and dependent on a similarity between the respective branch and the selected branch.

* * * * *

UNITED STATES PATENT AND TRADEMARK OFFICE
CERTIFICATE OF CORRECTION

| | |
|---|---|
| PATENT NO. | : 11,817,921 B2 |
| APPLICATION NO. | : 17/270010 |
| DATED | : November 14, 2023 |
| INVENTOR(S) | : Gao et al. |

It is certified that error appears in the above-identified patent and that said Letters Patent is hereby corrected as shown below:

On the Title Page

In Item (56), under "OTHER PUBLICATIONS", in Column 2, Line 1, delete ""a Comparative" and insert -- "A Comparative --, therefor.

In Item (56), under "OTHER PUBLICATIONS", in Column 2, Line 3, delete "No. 5,pp." and insert -- No. 5, pp. --, therefor.

On Page 2, in Item (56), under "OTHER PUBLICATIONS", in Column 1, Line 1, delete "a novel" and insert -- "A novel --, therefor.

In the Specification

In Column 4, Line 58, delete "$|f(x(n),\theta_i(n)) - f(x(n),\theta_j(n))| \leq \varepsilon$" and insert -- $|f(x(n),\theta_i(n)) - f(x(n),\theta_j(n))| \leq \varepsilon$ --, therefor.

In Column 6, Line 5, delete "$J(\theta_i(n)) = \|f(x(n),\theta_i(n)) - d(n)\|_2^2$:" and insert -- $J(\theta_i(n)) = \|f(x(n),\theta_i(n)) - d(n)\|_2^2$ --, therefor.

In Column 6, Line 26, delete "$(,)$" and insert -- $(\cdot)$ --, therefor.

Signed and Sealed this
Twenty-first Day of May, 2024

Katherine Kelly Vidal
*Director of the United States Patent and Trademark Office*

CERTIFICATE OF CORRECTION (continued)
U.S. Pat. No. 11,817,921 B2

In the Claims

In Column 9, Line 47, in Claim 7, delete "(SPS A)" and insert -- (SPSA) --, therefor.